United States Patent
Yamada et al.

(10) Patent No.: US 10,887,999 B2
(45) Date of Patent: Jan. 5, 2021

(54) MOUNTING BODY MANUFACTURING METHOD AND ANISOTROPIC CONDUCTIVE FILM

(71) Applicant: DEXERIALS CORPORATION, Tokyo (JP)

(72) Inventors: Yasunobu Yamada, Utsunomiya (JP); Morio Sekiguchi, Tatebayashi (JP); Susumu Kumakura, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/104,452

(22) PCT Filed: Dec. 10, 2014

(86) PCT No.: PCT/JP2014/082640
§ 371 (c)(1),
(2) Date: Jun. 14, 2016

(87) PCT Pub. No.: WO2015/093362
PCT Pub. Date: Jun. 25, 2015

(65) Prior Publication Data
US 2016/0316569 A1  Oct. 27, 2016

(30) Foreign Application Priority Data

Dec. 16, 2013 (JP) ................................ 2013-259194
Nov. 20, 2014 (JP) ................................ 2014-235554

(51) Int. Cl.
| | | |
|---|---|---|
| H01B 1/22 | (2006.01) | |
| C09J 9/02 | (2006.01) | |
| H05K 1/03 | (2006.01) | |
| H05K 3/22 | (2006.01) | |
| H05K 3/32 | (2006.01) | |
| H05K 1/18 | (2006.01) | |

(52) U.S. Cl.
CPC ............. *H05K 3/225* (2013.01); *C09J 9/02* (2013.01); *H01B 1/22* (2013.01); *H05K 1/0353* (2013.01); *H05K 1/181* (2013.01); *H05K 3/323* (2013.01); *H05K 2201/0133* (2013.01); *H05K 2201/023* (2013.01); *H05K 2201/0221* (2013.01); *H05K 2203/176* (2013.01)

(58) Field of Classification Search
CPC ...... H05K 3/225; H05K 1/0353; H05K 1/181; H05K 3/323; H05K 2201/0221; H05K 2203/176; H05K 1/0373; H05K 1/095; H05K 3/321; H05K 2201/0133; H05K 2201/023; H05K 2203/0278; H01B 1/20; H01B 1/22; C09J 9/02; C09J 163/00; C09J 163/04; C09D 5/24; C09D 7/65; C09D 7/66; C09D 7/67; C09D 7/68; C09D 7/69; C09D 163/00; C09D 163/04

USPC ........................................................ 252/500
See application file for complete search history.

(56) References Cited

U.S. PATENT DOCUMENTS

2011/0108878 A1  5/2011  Namiki et al.

FOREIGN PATENT DOCUMENTS

| | | | |
|---|---|---|---|
| JP | 2010-024301 A | | 2/2010 |
| JP | 2010-257991 A | | 11/2010 |
| JP | 2010257991 A | * | 11/2010 |
| JP | 2010-272545 A | | 12/2010 |
| JP | 2010272545 A | * | 12/2010 |
| JP | 2012-209097 A | | 10/2012 |
| JP | 2012209097 A | * | 10/2012 |
| WO | 2009/044732 A1 | | 4/2009 |

OTHER PUBLICATIONS

Mar. 17, 2015 International Search Report issued in International Patent Application No. PCT/JP2014/082640.
Oct. 17, 2018 Office Action issued in Chinese Patent Application No. 201480075640.7.
Jun. 25, 2019 Office Action issued in Malaysian Patent Application No. PI 2016001107.
Sep. 23, 2019 Office Action issued in Singaporean Patent Application No. 11201604899S.
Jun. 3, 2020 Office Action issued in European Patent Application No. 14 871 737.4.
Sep. 29, 2020 Office Action issued in Vietnamese Patent Application No. 1-2016-02539.
Oct. 28, 2020 Office Action issued in Korean Patent Application No. 10-2016-7015897.

* cited by examiner

*Primary Examiner* — Matthew R Diaz
(74) *Attorney, Agent, or Firm* — Oliff PLC

(57) ABSTRACT

A method for manufacturing a mounting body comprising: a mounting step of mounting an electronic component onto a wiring board via an anisotropic conductive film containing a binder having an epoxy resin as a primary constituent and conductive particles having a compressive hardness (K) of 500 kgf/mm$^2$ or more when compressively deformed by 10%, wherein a relation between a thickness (A) of the binder and an average particle diameter (B) is 0.6≤B/A≤1.5 and an elastic modulus of the binder after curing is 50 MPa or more at 100° C.; and a remounting step of mechanically peeling to detach the electronic component and the wiring board in the case of a problem occurring in mounting of the mounting step and reusing the wiring board to perform the mounting step.

15 Claims, No Drawings

MOUNTING BODY MANUFACTURING METHOD AND ANISOTROPIC CONDUCTIVE FILM

TECHNICAL FIELD

The present disclosure relates to a method for manufacturing a mounting body and an anisotropic conductive film for electrically and mechanically connecting respective electronic components. This application claims priority to Japanese Patent Application No. 2013-259194 filed on Dec. 16, 2013 and Japanese Patent Application No. 2014-235554 filed on Nov. 20, 2014, the entire contents of which are hereby incorporated by reference.

BACKGROUND ART

Conventionally, as a connecting film for electrically connecting respective electronic components, anisotropic conductive film (ACF) in which conductive particles are dispersed in an insulating binder has been used. Thermocompression bonding electrode portions of respective electronic components via ACF enables electrical connection formation in the direction of force application via the conductive particles while maintaining electrical insulation between adjacent electrodes; furthermore, the respective electronic components can be secured so as not to peel apart from one another.

A conventional issue concerning ACF connecting, in comparison with solder connecting, is rework difficulty. In the case of solder, components are easily detached and reconnected by heating the target rework product. In contrast, in the case of a target rework product having an ACF connection, when removing a component such as an FPC (flexible printed circuit), because the respective electronic components are strongly adhered together by the ACF, FPC circuit patterns might be damaged. Additionally, when detaching an FPC having cured ACF remaining on facing components, applying a dedicated repair agent and allowing a long standing time is necessary after which removal using, for example, cotton swabs is needed.

In response to these challenges, PLT 1 discloses a technique enabling re-compression bonding without using repair agent in which cured ACF is allowed to remain and a new ACF is applied. However, in the technique disclosed in PLT 1, because an elastic modulus of 10 MPa or less at 150° C. in the ACF cured product is required, ACF connection having high reliability (heat resistance) is difficult to obtain.

PRIOR ART LITERATURE

Patent Literatures

PLT 1: Japanese Unexamined Patent Application Publication No. 2010-272545

SUMMARY OF THE INVENTION

Problem to be Solved by the Invention

In view of such conventional circumstances, the present disclosure provides a method for manufacturing a mounting body and an anisotropic conductive film which facilitate easy rework and in which a high connection reliability can be achieved.

Solution to Problem

In order to solve the aforementioned problems, a method for manufacturing a mounting body according to the present disclosure comprises a mounting step of mounting an electronic component onto a wiring board via an anisotropic conductive film containing a binder having an epoxy resin as a primary constituent and conductive particles having a compressive hardness K of 500 kgf/mm$^2$ or more when compressively deformed by 10%, wherein a relation between a thickness A of the binder and an average particle diameter B is 0.6≤B/A≤1.5 and an elastic modulus of the binder after curing is 50 MPa or more at 100° C.; and a remounting step of mechanically peeling to detach the electronic component and the wiring board in the case of a problem occurring in the mounting step and reusing the wiring board to perform the mounting step.

Furthermore, an anisotropic conductive film according to the present disclosure comprises an epoxy resin as a primary constituent and conductive particles having a compressive hardness K of 500 kgf/mm$^2$ or more when compressively deformed by 10%; wherein a relation between a thickness A of the binder and an average particle diameter B is 0.6≤B/A≤1.5; and wherein the binder has an elastic modulus after curing of 50 MPa or more at 100° C.

Advantageous Effects of Invention

According to the present disclosure, destruction or deformation of wiring boards can be suppressed and because conduction can be ensured by penetration of conductive particles even in the case of cured ACF residue remaining on a reusable wiring board, rework can be simplified. Furthermore, a high elastic modulus in the binder after curing improves heat resistance and enables a high connection reliability.

DESCRIPTION OF EMBODIMENTS

Embodiments of the present disclosure will now be more particularly described according to the following order.
1. Mounting Body Manufacturing Method and Anisotropic
2. Examples
1. Mounting Body Manufacturing Method and Anisotropic Conductive Film A method for manufacturing a mounting body according to the present disclosure comprises a mounting step of mounting an electronic component onto a wiring board via an anisotropic conductive film containing a binder having an epoxy resin as a primary constituent and conductive particles having a compressive hardness K of 500 kgf/mm$^2$ or more when compressively deformed by 10%, wherein a relation between a thickness A of the binder and an average particle diameter B is 0.6≤B/A≤1.5 and an elastic modulus of the binder after curing is 50 MPa or more at 100° C.; and a remounting step of mechanically peeling to detach the electronic component and the wiring board in the case of a problem occurring in the mounting step and reusing the wiring board to perform the mounting step. In regards to a particle size distribution of a powder, the average particle diameter B which is normally expressed as D50, may be the particle diameter for which the number or mass of the particles at that size or larger account for 50% of the total number or mass of all of the particles in the powder.

Wiring boards and electronic components used in the method for manufacturing a mounting body are without particular limitation and components and materials applicable to connection methods such as FOF (film on film), FOB (film on board), GOG (glass on glass), COG (chip on glass), among others, can be favorably used and, for example, in FOF bonding, one of the components may even be a flying lead.

In the mounting step, first, the anisotropic conductive film is arranged on a predetermined position on the wiring board and the wiring board and the anisotropic conductive film are temporarily pressure bonded. In the temporary pressure bonding, while applying a light pressure to the anisotropic conductive film, by applying a temperature at which the epoxy resin constituent of the anisotropic conductive film does not cure, for example, a temperature from 70 to 100° C., the wiring board and the anisotropic conductive film are temporarily pressure bonded. Thus, by an appropriate adhesive strength of the anisotropic conductive film, temporary pressure bonding and secure positioning of the anisotropic conductive film on the wiring board is enabled.

After temporary pressure bonding, the alignment status of the anisotropic conductive film is confirmed and, in the absence of problems such as misalignment, the electronic component is placed onto a selected position on the anisotropic conductive film. Subsequently, heat is applied while applying pressure onto the electronic component in order to perform final pressure bonding. In the final pressure bonding, a heat is applied at a temperature at or in excess of a curing temperature of the thermosetting resin contained in the anisotropic conductive film. Additionally, in the final pressure bonding, such a pressure is applied as to deform the conductive particles contained in the anisotropic conductive film. For example, temperature and pressure conditions during final pressure bonding, while depending on such factors as the variety of anisotropic conductive film used, are a temperature from approximately 180° C. to 220° C. and a pressure of approximately 2 MPa to 5 MPa. By such a final pressure bonding step, a mounting body is manufactured in which the electronic component is mounted to the wiring board via the anisotropic conductive film. In the mounting body, peel strength between the wiring board and the electronic component is preferably 5.0 to 9.0 N/cm. By peel strength being within this range, in the case of repair work being necessary, destruction or deformation of the wiring board can be suppressed and the wiring board can be reused.

Next, alignment conditions of the wiring board and the anisotropic conductive film, mechanical connection conditions such as connection strength and conductive connection conditions such as electrical resistance in the mounting body are confirmed. Then, in the case of a problem in any of these connection conditions occurring in the mounting body, work proceeds to the remounting step of performing repair work.

In the repair work of the remounting step, the electronic component and the anisotropic conductive film are peeled to mechanically detach them from the wiring board of the mounting body in which the problematic connection condition occurred. Normally, after this detachment, the surface of the wiring board is cleaned by removing residue remaining thereon with, for example, a solvent, and the wiring board is reused; however, in this embodiment, the anisotropic conductive film, in addition to suppressing destruction and deformation of the wiring board, can ensure conduction because the conductive particles can penetrate even in the case of cured ACF residue remaining on the wiring board. It should be noted that anisotropic conductive film residue can be confirmed by, for example, image processing using a glass substrate.

Anisotropic Conductive Film

In remounting conditions in which cured ACF residue remains on the wiring board, the relation between a thickness A of the binder of the anisotropic conductive film and an average particle diameter B of the conductive particles is $0.6 \leq B/A \leq 1.5$ and more preferably $0.6 \leq B/A \leq 1.0$. Along with suppressing destruction or deformation of the wiring board during repair work, reliable conduction can thus be ensured and excellent temporary pasting properties can be obtained. Furthermore, the thickness A of the binder is preferably 15 μm or less. If thickness of the binder is excessive, excessive peel strength in the binder might cause destruction or deformation of the wiring board during processes for detaching the wiring board during repair work, making reuse of the wiring board impossible.

Furthermore, the elastic modulus at 100° C. of the binder after curing is preferably 50 MPa or more and more preferably 75 MPa to 800 MPa. Insufficient elastic modulus after curing worsens conduction reliability in high-temperature and high-humidity environments and excessive elastic modulus after curing, when applying a new ACF in conditions in which cured ACF remains, leads to difficulties in penetration by the conductive particles through cured ACF residue and ensuring conduction is difficult.

The binder contains an epoxy resin, a film-forming resin and a curing agent. By using an epoxy-type binder, a high elastic modulus after curing can be achieved and conduction reliability can be improved in high-temperature and high-humidity environments. Furthermore, spring-back occurring in acrylic-type binders can be suppressed, and a reliable ACF connection can be realized.

As the epoxy resin, in view of curing speed, a bifunctional epoxy resin is preferably used. Examples of bifunctional epoxy resins include bisphenol type epoxy resins such as bisphenol A type epoxy resins, bisphenol F type epoxy resins and bisphenol S type epoxy resins; bifunctional epoxy resins having a naphthalene skeleton such as diglycidyl ether of 1,4-dihydroxynaphthalene, diglycidyl ether of 1,5-dihydroxynaphthalene, diglycidyl ether of 1,6-dihydroxynaphthalene, diglycidyl ether of 2,6-dihydroxynaphthalene, diglycidyl ether of 2,7-dihydroxynaphthalene and diglycidyl ether of 1,1-bi-2-naphthol; biphenol type epoxy resins such as diglycidyl ether of 4,4'-biphenol and diglycidyl ether of 3,3',5,5'-tetramethyl-4,4'-biphenol; diglycidyl ethers of monocyclic bifunctional phenols such as catechol, resorcinol and hydroquinone; epoxy resins such as diglycidyl ether of bisphenol fluorene, diglycidyl ether of bisphenol acetophenone, dihydroxybiphenyl ether and diglycidyl ether of dihydroxybiphenyl thioether; epoxy resins such as those having diglycidyl ethers of bifunctional alcohols such as cyclohexanedimethanol, 1,6-hexanediol and neopentyl glycol; and epoxy resins such as those having diglycidyl esters of dicarboxylic acid such as phthalic acid, isophthalic acid, tetrahydrophthalic acid and hexahydrophthalic acid. Substituents having no adverse effect such as alkyl groups, aryl groups, ether groups and ester groups, among others, may be substituted in these bifunctional epoxy resins and these can be used individually or in a combination of two or more. Among these, a bisphenol type epoxy resin is particularly suitable for use in this embodiment.

The film-forming resin has an average molecular weight of 10000 or more, equivalent to high molecular weight resins, and an average molecular weight of approximately 10000 to 80000 is preferable in view of film-forming characteristics. Examples of usable film-forming resins include phenoxy resins, polyester resins, polyurethane resins, polyester urethane resins, acrylic resins, polyimide resins and butyral resin, among a variety of other resins, and these may be used individually or in a combination of two or more. Among these, in view of such properties as film-formed state and connection reliability, a phenoxy resin is particularly suitable for use.

As the curing agent, either an anion-type or cation-type may be used. Examples of the curing agent include anion-type curing agents such as polyamine and imidazole, cation-type curing agents such as sulfonium salt, and latent curing agents such as microcapsule-types in which a cured polymer such as polyurethane or polyester is coated to the surface of imidazole compound particles.

Because excessive adhesive force of the binder might cause the wiring board to be damaged during repair making reuse difficult, the binder preferably contains an elastomer made from an acrylic rubber. In the case of performing repair work, a wiring board in a reusable condition can thus be obtained. The acrylic rubber is, for example, a copolymer containing acrylic acid ester and acrylonitrile as primary constituents and one or more of acrylic acid, methacrylic acid, glycidyl acrylate and glycidyl methacrylate, among other constituents. A particularly suitable weight-average molecular weight Mw for the acrylic rubber is from 200000 to 1000000. An insufficient weight-average molecular weight Mw reduces cohesive strength and leads to difficulties in obtaining a high elastic modulus. An excessive weight-average molecular weight Mw reduces compatibility with other constituents. It should be noted that the weight-average molecular weight Mw can be obtained by GPC by using a styrene reference value. Furthermore, a silane coupling agent is preferably not blended in the binder. Excessive adhesive force in the binder can thus be prevented.

The conductive particles preferably have a compressive hardness K of 500 kgf/mm$^2$ or more when compressively deformed by 10% and more preferably have a compressive hardness K of 3000 kgf/mm$^2$ or more when compressively deformed by 10%. Hardness of the conductive particles enables penetration of the conductive particles even in the case of cured ACF residue remaining on the wiring board so that re-pressure bonding can be performed without using a repair agent.

The compressive hardness K of the conductive particles under a compressive deformation of 10% can be calculated by the following formula (1).

$$K = (3/\sqrt{2}) F \cdot S^{-3/2} \cdot R^{-1/2} \quad (1)$$

wherein, F and S respectively represent load value (kgf) and compressive displacement of the conductive particles under 10% compressive deformation; R represents radius (mm) of the conductive particles.

Known conductive particles used in anisotropic conductive films may be used as the conductive particles. Examples of conductive particles include particles of metals or metal alloys such as those of nickel, iron, copper, aluminum, tin, lead, chromium, cobalt, silver or gold or particles such as those of metal oxides, carbon, graphite, glass, ceramics and plastics coated with metal and these particles may be further coated with a thin electrically-insulating film. Among these, in view of such factors as particle hardness and connection reliability, nickel particles are particularly suitable for use. Additionally, average particle diameter (D50) of the conductive particles is normally from 1 to 20 μm and more preferably from 2 to 10 μm.

In the anisotropic conductive film having such a configuration, destruction of the wiring board can be suppressed, and, even in the case of cured ACF residue being on the wiring board, the conductive particles can penetrate and conduction can be ensured. Furthermore, a high elastic modulus in the binder after curing improves heat resistance and enables a high connection reliability.

4. Examples

EXAMPLES

Examples of the present disclosure will now be described. In these examples, anisotropic conductive films having differing conductive particle average particle diameters (D50), conductive particle compressive hardnesses, after-curing binder elastic moduli and binder thicknesses were manufactured, and temporary pasting properties were evaluated for each anisotropic conductive film. Furthermore, mounting bodies using each of the anisotropic conductive films and respective flexible substrates (FPC: flexible printed circuits) were manufactured and FPC peel strength and FPC damage conditions were evaluated. For conduction characteristics, wiring boards were detached from ACF mounting bodies and, after applying new ACF to perform remounting in a state in which cured ACF residue remained, initial conductive resistance and conduction reliability were evaluated. It should be noted that the present invention is not limited to these examples.

Measurement and Evaluation

Each type of measurement and evaluation were performed in the following manner.

Binder Elastic Modulus Measurement

Using a dynamic viscoelasticity measuring instrument (manufactured by ORIENTEC CO., LTD.), storage moduli (E') were measured in the binders after curing. The binders were placed between PET films and left to stand for 10 minutes in an oven at 200° C. to cure; subsequently, the PET films were peeled off and storage moduli (E') of the binders after curing were measured. It should be noted that the measurements were performed under conditions of tension mode and a frequency of 1.1 Hz.

Cured products having an elastic modulus at 100° C. of 900 MPa or more were evaluated as Very Good (hereinafter referred to as VG), cases of 75 MPa or more and less than 900 MPa where evaluated as Good (hereinafter referred to as G), cases of 50 MPa or more and less than 75 MPa were evaluated as Intermediate (hereinafter referred to as I) and cases of less than 50 MPa were evaluated as Fail (hereinafter referred to as F).

Conductive Particle Compressive Hardness Measurement

A microcompression testing machine (Model: PCT-200, manufactured by Shimadzu Corporation) was used to measure compressive hardness (K value) of the conductive particles at 10% compressive deformation.

Anisotropic Conductive Film Temporary Pasting Properties Evaluation

A PET film A was placed onto a hot stage set to 70° C.; after arranging ACF cut to 50×50 mm and performing two round-trip roller-bar pressings at 5 kg, the release-treated film of the ACF was peeled; then, a PET film B was placed in overlap thereabove and, after laminating, another two round-trip roller-bar pressings were performed from above to temporarily secure the PET films to each other in order to manufacture a temporarily bonded sample.

Cases in which the above temporarily connected sample manufacturing process could manufacture a temporarily bonded sample were evaluated as successful. When peeling the release-treated film from the ACF, in such cases as breakage or wrinkling making lamination impossible and/or in such cases as difficulties in forming a temporary bond between the PET film A and the PET film B, the respective films peeled apart and it was not possible to manufacture a temporarily bonded sample were evaluated as failures.

In assessment, the above temporarily bonded sample manufacturing process was performed ten times and the number of successes was determined. Cases in which the temporarily bonded sample was successfully manufactured ten times were evaluated as G. Cases in which the temporarily bonded sample was successfully manufactured from five to nine times were evaluated as I. Cases in which the temporarily bonded sample was successfully manufactured zero to four times were evaluated as F.

Peel Strength Measurement

In mounting bodies having respective flexible substrates (FPC) bonded by ACF, the two liquids constituting Bond Quick 5 adhesive agent manufactured Konishi Co., Ltd. were mixed and then applied to one of the flexible substrates; then, the mounting body was bonded by pasting to a 1.0 mm-thick glass epoxy plate and leaving to stand for 12 hours at room temperature. Peel strengths of ACF bonded portions in these test specimens were measured by peeling the flexible substrate in the 90° direction using a peel tester (Tensilon manufactured by Oriontec) in conformation with JIS K6854-1 (1999). Peel speed was 50 mm/min.

Flexible Substrate Damage Status Evaluation

In the mounting bodies having the respective flexible substrates (FPC-A and FPC-B) and being manufactured using the anisotropic conductive film, the flexible substrates were peeled apart and damage status of the FPC-B was observed. Damage status was observed and evaluated for ten mounting bodies. Cases of 10/10 undestroyed and reusable samples were evaluated as VG, cases of 8-9/10 undestroyed and reusable samples were evaluated as G, cases of 5-7/10 undestroyed and reusable samples were evaluated as I and cases of 4/10 or less undestroyed and reusable samples were evaluated as F.

Electrical Resistance Measurement

The FPC-B was peeled from the mounting bodies having the respective flexible substrates (FPC-A and FPC-B) manufactured using the anisotropic conductive adhesive, a new ACF was applied onto the FPC-B in state in which cured ACF residue remained, and the FPC-A was remounted. In these reworked mounting bodies, initial electrical resistance and electrical resistance after a 1000-hour TH (thermal humidity) test at a temperature of 85° C. and a relative humidity of 85% were measured. Electrical resistance was measured by using four-terminal sensing with a digital multimeter (Digital Multimeter 7561 manufactured by Yokogawa Meters & Instruments Corporation).

In evaluating initial electrical resistance and conduction reliability, a resistance of less than 0.5Ω was evaluated as G, a resistance of more than 0.5Ω and less than 1.0Ω was evaluated as I, a resistance of more than 1.0Ω was evaluated as F and cases in which the FPC-B was damaged when peeling the flexible substrates apart during rework, making pressure bonding impossible, were evaluated as FF.

Anisotropic Conductive Film

Anisotropic conductive films were manufactured using Blends 1 to 9. Blends 1 to 8 having epoxy resin as a primary constituent are represented in Table 1.

TABLE 1

|  | Blend 1 | Blend 2 | Blend 3 | Blend 4 | Blend 5 | Blend 6 | Blend 7 | Blend 8 | Blend 10 |
|---|---|---|---|---|---|---|---|---|---|
| Epoxy resin | 20 | 20 | 20 | 20 | 10 | 10 | 20 | 20 | 20 |
| Phenoxy resin | 40 | 20 | 40 | 40 | 40 | 25 | 40 | 40 | 40 |
| Curing agent | 40 | 40 | 40 | 40 | 10 | 25 | 40 | 40 | 40 |
| Elastomer | — | 20 | — | — | 40 | 40 | — | — | — |
| Silane coupling Agent | — | — | 1 | — | — | — | — | — | — |
| Conductive particles A | 15 | 15 | 15 | — | 15 | 15 | — | — | — |
| Conductive particles B | — | — | — | — | — | — | 15 | — | — |
| Conductive particles C | — | — | — | — | — | — | — | 15 | — |
| Conductive particles D | — | — | — | 15 | — | — | — | — | — |
| Conductive particles E | — | — | — | — | — | — | — | — | 15 |

Epoxy resin: EP-828 (manufactured by Mitsubishi Chemical Corporation)
Phenoxy resin: YP-50 (manufactured by Tohto Kasei Co., Ltd)
Curing agent: Novacure 3941HP (manufactured by Asahi Kasei E-materials Corporation)
Elastomer: Teisan Resin SG-80H (manufactured by Nagase ChemteX Corporation), weight-average molecular weight 350000
Silane coupling agent: A-187 manufactured by Momentive Performance Materials Inc.
Conductive particles A: nickel particles, average particle diameter (D50) 6 μm, 10% K value 4000 kgf/mm$^2$
Conductive particles B: nickel particles, average particle diameter (D50) 10 μm, 10% K value 4000 kgf/mm$^2$
Conductive particles C: nickel particles, average particle diameter (D50) 20 μm, 10% K value 4000 kgf/mm$^2$
Conductive particles D: Micropearl AUL (manufactured by Sekisui Chemical Co., Ltd.), metal plated resin particles, average particle diameter (D50) 5 μm, 10% K value 250 kgf/mm$^2$
Conductive particles E: BRIGHT (manufactured by Nippon Chemical Industrial CO., LTD.) metal plated resin particles, average particle diameter (D50) 5 μm, 10% K value 700 kgf/mm$^2$ Blend 1

As represented in table 1, into 20 pts. mass of the epoxy resin, 40 pts. mass of the phenoxy resin and 40 pts. mass of the curing agent, 15 pts. mass of the conductive particles A were dispersed and an anisotropic conductive film of a predetermined thickness was manufactured.

Blend 2

As represented in table 1, into 20 pts. mass of the epoxy resin, 20 pts. mass of the phenoxy resin, 20 pts. mass of the elastomer and 40 pts. mass of the curing agent, 15 pts. mass of the conductive particles A were dispersed and an anisotropic conductive film of a predetermined thickness was manufactured.

Blend 3

As represented in table 1, into 20 pts. mass of the epoxy resin, 40 pts. mass of the phenoxy resin, 1 pt. mass of the silane coupling agent and 40 pts. mass of the curing agent, 15 pts. mass of the conductive particles A were dispersed and an anisotropic conductive film of a predetermined thickness was manufactured.

Blend 4

As represented in table 1, into 20 pts. mass of the epoxy resin, 40 pts. mass of the phenoxy resin and 40 pts. mass of the curing agent, 15 pts. mass of the conductive particles D were dispersed and an anisotropic conductive film of a predetermined thickness was manufactured.

Blend 5

As represented in table 1, into 10 pts. mass of the epoxy resin, 40 pts. mass of the phenoxy resin, 40 pts. mass of the elastomer and 10 pts. mass of the curing agent, 15 pts. mass of the conductive particles A were dispersed and an anisotropic conductive film of a predetermined thickness was manufactured.

Blend 6

As represented in table, into 10 pts. mass of the epoxy resin, 25 pts. mass of the phenoxy resin, 40 pts. mass of the elastomer and 25 pts. mass of the curing agent, 15 pts. mass of the conductive particles A were dispersed and an anisotropic conductive film of a predetermined thickness was manufactured.

Blend 7

As represented in table 1, into 20 pts. mass of the epoxy resin, 40 pts. mass of the phenoxy resin and 40 pts. mass of the curing agent, 15 pts. mass of the conductive particles B were dispersed and an anisotropic conductive film of a predetermined thickness was manufactured.

Blend 8

As represented in table 1, into 20 pts. mass of the epoxy resin, 40 pts. mass of the phenoxy resin and 40 pts. mass of the curing agent, 15 pts. mass of the conductive particles C were dispersed and an anisotropic conductive film of a predetermined thickness was manufactured.

Blend 9

As a binder, 25 pts. of an acrylate A (DCP manufactured by SHIN-NAKAMURA CHEMICAL CO, LTD.), 20 pts. mass of an epoxy acrylate B (VR-90 manufactured by SHOWA DENKO K.K.), 25 pts. mass of a phenoxy resin (YP-70 manufactured by NIPPON STEEL & SUMIKIN CHEMICAL CO., LTD.), 15 pts. mass of a urethane resin (Desmocoll 540 manufactured by Sumika Bayer Urethane Co., Ltd.), 12 pts. mass of a polybutadiene rubber (XER-91 manufactured by JSR Corporation) and 3 pts. mass of a peroxide (Nyper BW manufactured by NOF CORPORATION) were blended. Into this binder, the conductive particles A were dispersed at 12% by volume and an anisotropic conductive film of a predetermined thickness was manufactured.

Blend 10

As represented in table 1, into 20 pts. mass of the epoxy resin, 40 pts. mass of the phenoxy resin and 40 pts. mass of the curing agent, 15 pts. mass of the conductive particles E were dispersed and an anisotropic conductive film of a predetermined thickness was manufactured.

Example 1

As represented in Table 2, an anisotropic conductive film was manufactured using the binder of the Blend 6 at a thickness A of 8 µm. The average particle diameter B of the conductive particles was 6 µm and B/A was 0.75. Furthermore, elastic modulus of the binder at 100° C. was 80 MPa and was evaluated as G. Still further, the 10% K value of the conductive particles was 4000 kgf/mm$^2$. Temporary pasting properties for this anisotropic conductive film were evaluated as G.

Using this anisotropic conductive film, mounting bodies were manufactured by thermocompression bonding flexible substrates A1 (25 µm-thick polyimide, 12 µm t Cu wiring (Ni/Au plating), 400 µm P (LS=1/1)) and flexible substrates B (25 µm-thick polyimide, 12 µm t Cu wiring (Ni/Au plating), 400 µm P (LS=1/1)) under conditions of 190° C., 3 MPa and 10 seconds. Then, the flexible substrate B (FPC-B) was peeled from these mounting bodies and a new ACF was applied onto the FPC-B on which cured ACF residue remained, and the flexible substrate A1 (FPC-A1) was remounted. It should be noted that mounting bodies both before and after rework were manufactured under the same pressure bonding conditions.

Peel strength of the flexible substrate in these mounting bodies was 7.9 N/cm and evaluation after detachment of the flexible substrate B was VG. Moreover, initial electrical resistance after remounting was evaluated as G, and electrical resistance after the high-temperature and high-humidity test was evaluated as G.

Example 2

As represented in Table 2, an anisotropic conductive film was manufactured using the binder of the Blend 6 at a thickness A of 8 µm. The average particle diameter B of the conductive particles was 6 µm and B/A was 0.75. Furthermore, elastic modulus of the binder at 100° C. was 80 MPa and was evaluated as G. Still further, the 10% K value of the conductive particles was 4000 kgf/mm$^2$. Temporary pasting properties for this anisotropic conductive film were evaluated as G.

Using this anisotropic conductive film, mounting bodies were manufactured by thermocompression bonding flexible substrates A2 (a flexible substrate in which a 5 mm wide section of polyimide film is removed from the terminal portion of the flexible substrate A1 to expose wiring) to flexible substrates B (25 µm-thick polyimide, 12 µm t Cu wiring (Ni/Au plating), 400 µm P (LS=1/1)) under conditions of 190° C., 3 MPa and 10 seconds. Then, the flexible substrate B (FPC-B) was peeled from these mounting bodies and a new ACF was applied onto the flexible substrate B on which cured ACF residue remained, and the flexible substrate A2 (FPC-A2) was remounted. It should be noted that mounting bodies both before and after rework were manufactured under the same pressure bonding conditions.

Peel strength of the flexible substrate in these mounting bodies was 7.9 N/cm and evaluation after detachment of the flexible substrate B was VG. Moreover, initial electrical resistance after remounting was evaluated as G, and electrical resistance after the high-temperature and high-humidity test was evaluated as G.

Example 3

As represented in Table 2, an anisotropic conductive film was manufactured using the binder of the Blend 6 at a thickness A of 4 µm. The average particle diameter B of the conductive particles was 6 µm and B/A was 1.5. Furthermore, elastic modulus of the binder at 100° C. was 80 MPa and was evaluated as G. Still further, the 10% K value of the conductive particles was 4000 kgf/mm$^2$. Temporary pasting properties for this anisotropic conductive film were evaluated as 1.

Using this anisotropic conductive film, mounting bodies were manufactured in the same manner as in Example 1. Peel strength of the flexible substrate in these mounting bodies was 7.2 N/cm and evaluation after detachment of the flexible substrate B was VG. Moreover, initial electrical resistance after remounting was evaluated as G, and electrical resistance after the high-temperature and high-humidity test was evaluated as G.

Example 4

As represented in Table 2, an anisotropic conductive film was manufactured using the binder of the Blend 6 at a thickness A of 10 µm. The average particle diameter B of the conductive particles was 6 µm and B/A was 0.6. Furthermore, elastic modulus of the binder at 100° C. was 80 MPa and was evaluated as G. Still further, the 10% K value of the conductive particles was 4000 kgf/mm$^2$. Temporary pasting properties for this anisotropic conductive film were evaluated as G.

Using this anisotropic conductive film, mounting bodies were manufactured in the same manner as in Example 1. Peel strength of the flexible substrate in these mounting bodies was 8.4 N/cm and evaluation after detachment of the flexible substrate B was VG. Moreover, initial electrical resistance after remounting was evaluated as G, and electrical resistance after the high-temperature and high-humidity test was evaluated as G.

Comparative Example 1

As represented in Table 2, an anisotropic conductive film was manufactured using the binder of the Blend 6 at a thickness A of 3 µm. The average particle diameter B of the conductive particles was 6 µm and B/A was 2.0. Furthermore, elastic modulus of the binder at 100° C. was 80 MPa and was evaluated as G. Still further, the 10% K value of the conductive particles was 4000 kgf/mm$^2$. Temporary pasting properties for this anisotropic conductive film were evaluated as F.

Using this anisotropic conductive film, mounting bodies were manufactured in the same manner as in Example 1. Peel strength of the flexible substrate in these mounting bodies was 6.0 N/cm and evaluation after detachment of the flexible substrate B was VG. Moreover, initial electrical resistance after remounting was evaluated as G, and electrical resistance after the high-temperature and high-humidity test was evaluated as G.

Comparative Example 2

As represented in Table 2, an anisotropic conductive film was manufactured using the binder of the Blend 6 having a thickness A of 12 µm. The average particle diameter B of the conductive particles was 6 µm and B/A was 0.5. Furthermore, elastic modulus of the binder at 100° C. was 80 MPa and was evaluated as G. Still further, the 10% K value of the conductive particles was 4000 kgf/mm$^2$. Temporary pasting properties for this anisotropic conductive film were evaluated as G.

Using this anisotropic conductive film, mounting bodies were manufactured in the same manner as in Example 1. Peel strength of the flexible substrate in these mounting bodies was 8.9 N/cm and evaluation after detachment of the flexible substrate B was F. Moreover, initial electrical resistance after remounting was evaluated as FF, and electrical resistance after the high-temperature and high-humidity test was evaluated as FF.

Example 5

As represented in Table 2, an anisotropic conductive film was manufactured using the binder of the Blend 7 having a thickness A of 12 µm. The average particle diameter B of the conductive particles was 10 µm and B/A was 0.83. Furthermore, elastic modulus of the binder at 100° C. was 900 MPa and was evaluated as VG. Still further, the 10% K value of the conductive particles was 4000 kgf/mm$^2$. temporary pasting properties for this anisotropic conductive film were evaluated as G.

Using this anisotropic conductive film, mounting bodies were manufactured in the same manner as in Example 1. Peel strength of the flexible substrate in these mounting bodies was 8.7 N/cm and evaluation after detachment of the flexible substrate B was G. Moreover, initial electrical resistance after remounting was evaluated as G, and electrical resistance after the high-temperature and high-humidity test was evaluated as G.

Comparative Example 3

As represented in Table 2, an anisotropic conductive film was manufactured using the binder of the Blend 7 having a thickness A of 4 µm. The average particle diameter B of the conductive particles was 10 µm and B/A was 2.5. Furthermore, elastic modulus of the binder at 100° C. was 900 MPa and was evaluated as VG. Still further, the 10% K value of the conductive particles was 4000 kgf/mm$^2$. temporary pasting properties for this anisotropic conductive film were evaluated as F.

Using this anisotropic conductive film, mounting bodies were manufactured in the same manner as in Example 1. Peel strength of the flexible substrate in these mounting bodies was 7.0 N/cm and evaluation after detachment of the flexible substrate B was VG. Moreover, initial electrical resistance after remounting was evaluated as G, and electrical resistance after the high-temperature and high-humidity test was evaluated as G.

Example 6

As represented in Table 2, an anisotropic conductive film was manufactured using the binder of the Blend 1 having a thickness A of 8 µm. The average particle diameter B of the conductive particles was 6 µm and B/A was 0.75. Furthermore, elastic modulus of the binder at 100° C. was 900 MPa and was evaluated as VG. Still further, the 10% K value of the conductive particles was 4000 kgf/mm$^2$. Temporary pasting properties for this anisotropic conductive film were evaluated as G.

Using this anisotropic conductive film, mounting bodies were manufactured in the same manner as in Example 1. Peel strength of the flexible substrate in these mounting bodies was 6.2 N/cm and evaluation after detachment of the flexible substrate B was G. Moreover, initial electrical resistance after remounting was evaluated as I, and electrical resistance after the high-temperature and high-humidity test was evaluated as I.

Example 7

As represented in Table 2, an anisotropic conductive film was manufactured using the binder of the Blend 5 having a thickness A of 8 µm. The average particle diameter B of the conductive particles was 6 µm and B/A was 0.75. Furthermore, elastic modulus of the binder at 100° C. was 60 MPa and was evaluated as I. Still further, the 10% K value of the conductive particles was 4000 kgf/mm$^2$. Temporary pasting properties for this anisotropic conductive film were evaluated as G.

Using this anisotropic conductive film, mounting bodies were manufactured in the same manner as in Example 1. Peel strength of the flexible substrate in these mounting bodies was 8.2 N/cm and evaluation after detachment of the flexible substrate B was VG. Moreover, initial electrical resistance after remounting was evaluated as G, and electrical resistance after the high-temperature and high-humidity test was evaluated as I.

Example 8

As represented in Table 2, an anisotropic conductive film was manufactured using the binder of the Blend 2 having a thickness A of 8 μm. The average particle diameter B of the conductive particles was 6 μm and B/A was 0.75. Furthermore, elastic modulus of the binder at 100° C. was 800 MPa and was evaluated as G. Still further, the 10% K value of the conductive particles was 4000 kgf/mm². Temporary pasting properties for this anisotropic conductive film were evaluated as G.

Using this anisotropic conductive film, mounting bodies were manufactured in the same manner as in Example 1. Peel strength of the flexible substrate in these mounting bodies was 7.1 N/cm and evaluation after detachment of the flexible substrate B was VG. Moreover, initial electrical resistance after remounting was evaluated as G, and electrical resistance after the high-temperature and high-humidity test was evaluated as G.

Example 9

As represented in Table 2, an anisotropic conductive film was manufactured using the binder of the Blend 3 having a thickness A of 8 μm. The average particle diameter B of the conductive particles was 6 μm and B/A was 0.75. Furthermore, elastic modulus of the binder at 100° C. was 900 MPa and was evaluated as VG. Still further, the 100% K value of the conductive particles was 4000 kgf/mm². Temporary pasting properties for this anisotropic conductive film were evaluated as G.

Using this anisotropic conductive film, mounting bodies were manufactured in the same manner as in Example 1. Peel strength of the flexible substrate in these mounting bodies was 8.1 N/cm and evaluation after detachment of the flexible substrate B was G. Moreover, initial electrical resistance after remounting was evaluated as I, and electrical resistance after the high-temperature and high-humidity test was evaluated as 1.

Comparative Example 4

As represented in Table 2, an anisotropic conductive film was manufactured using the binder of the Blend 8 having a thickness A of 26 μm. The average particle diameter B of the conductive particles was 20 μm and B/A was 0.77. Furthermore, elastic modulus of the binder at 100° C. was 900 MPa and was evaluated as VG. Still further, the 10% K value of the conductive particles was 4000 kgf/mm². Temporary pasting properties for this anisotropic conductive film were evaluated as G.

Using this anisotropic conductive film, mounting bodies were manufactured in the same manner as in Example 1. Peel strength of the flexible substrate in these mounting bodies was 9.2 N/cm and evaluation after detachment of the flexible substrate B was F. Moreover, initial electrical resistance after remounting was evaluated as FF, and electrical resistance after the high-temperature and high-humidity test was evaluated as FF.

Comparative Example 5

As represented in Table 2, an anisotropic conductive film was manufactured using the binder of the Blend 4 having a thickness A of 8 μm. The average particle diameter B of the conductive particles was 5 μm and B/A was 0.63. Furthermore, elastic modulus of the binder at 100° C. was 900 MPa and was evaluated as VG. Still further, 10% K value of the conductive particles was 250 kgf/mm². Temporary pasting properties for this anisotropic conductive film were evaluated as G.

Using this anisotropic conductive film, mounting bodies were manufactured in the same manner as in Example 1. Peel strength of the flexible substrate in these mounting bodies was 6.4 N/cm and evaluation after detachment of the flexible substrate B was G. Moreover, initial electrical resistance after remounting was evaluated as F, and electrical resistance after the high-temperature and high-humidity test was evaluated as F.

Comparative Example 6

As represented in Table 2, an anisotropic conductive film was manufactured using the binder of the Blend 9 having a thickness A of 8 μm. The average particle diameter B of the conductive particles was 6 μm and B/A was 0.75. Furthermore, elastic modulus of the binder at 100° C. was 15 MPa and was evaluated as F. Still further, the 10% K value of the conductive particles was 4000 kgf/mm². Temporary pasting properties for this anisotropic conductive film were evaluated as G.

Using this anisotropic conductive film, mounting bodies were manufactured in the same manner as in Example 1 with the exception that thermocompression bonding conditions were 150° C., 3 MPa and 10 seconds. Peel strength of the flexible substrate in these mounting bodies was 8.2 N/cm and evaluation after detachment of the flexible substrate B was G. Moreover, initial electrical resistance after remounting was evaluated as G, and electrical resistance after the high-temperature and high-humidity test was evaluated as F.

Example 10

As represented in Table 2, an anisotropic conductive film was manufactured using the binder of the Blend 10 having a thickness A of 8 μm. The average particle diameter B of the conductive particles was 5 μm and B/A was 0.63. Furthermore, elastic modulus of the binder at 100° C. was 900 MPa and was evaluated as VG. Still further, the 10% K value of the conductive particles was 700 kgf/mm². Temporary pasting properties for this anisotropic conductive film were evaluated as G.

Using this anisotropic conductive film, mounting bodies were manufactured in the same manner as in Example 1. Peel strength of the flexible substrate in these mounting bodies was 6.4 N/cm and evaluation after detachment of the flexible substrate B was G. Moreover, initial electrical resistance after remounting was evaluated as G, and electrical resistance after the high-temperature and high-humidity test was evaluated as I.

Example 11

As represented in Table 2, an anisotropic conductive film was manufactured using the binder of the Blend 7 having a thickness A of 16 μm. The average particle diameter B of the conductive particles was 10 μm and B/A was 0.63. Furthermore, elastic modulus of the binder at 100° C. was 900 MPa and was evaluated as VG. Still further, the 10% K value of the conductive particles was 4000 kgf/mm². Temporary pasting properties for this anisotropic conductive film were evaluated as G.

Using this anisotropic conductive film, mounting bodies were manufactured in the same manner as in Example 1. Peel strength of the flexible substrate in these mounting bodies was 9.0 N/cm and evaluation after detachment of the flexible substrate B was I. Moreover, initial electrical resistance after remounting was evaluated as G, and electrical resistance after the high-temperature and high-humidity test was evaluated as G.

Further, as in Examples 1 to 11, in the case of the elastic modulus of the binder after curing being 50 MPa or more at 100° C., electrical resistance evaluations after the high-temperature high-humidity test were favorable; particularly, in the case of the elastic modulus of the binder after curing being from 80 to 800 MPa at 100° C., conducting properties in mounted bodies after rework (re-compression bonded products) were especially favorable.

Still further, as in Examples 1 to 11, in the case of the thickness A of the binder being 16 μm or less, half or more of the flexible substrate B were undestroyed after detach-

TABLE 2

| | Ex. 1 | Ex. 2 | Ex. 3 | Ex. 4 | Comp. 1 | Comp. 2 | Ex. 5 | Comp. 3 | Ex. 6 | Ex. 7 | Ex. 8 | Ex. 9 | Comp. 4 | Comp. 5 | Comp. 6 | Ex. 10 | Ex. 11 |
|---|---|---|---|---|---|---|---|---|---|---|---|---|---|---|---|---|---|
| Blend | 8 | 6 | 6 | 8 | 6 | 6 | 7 | 7 | 1 | 5 | 2 | 3 | 8 | 4 | 6 | 10 | 7 |
| Thickness A [um] | 8 | 8 | 4 | 10 | 5 | 12 | 12 | 4 | 8 | 8 | 8 | 8 | 20 | 8 | 8 | 8 | 18 |
| Particle diameter [um] | 6 | 6 | 6 | 6 | 8 | 6 | 10 | 10 | 6 | 8 | 8 | 8 | 20 | 5 | 6 | 5 | 10 |
| B/A | 0.75 | 0.75 | 1.50 | 0.60 | 2.00 | 0.50 | 0.83 | 2.50 | 0.75 | 0.75 | 0.75 | 0.75 | 0.73 | 0.63 | 0.75 | 0.83 | 0.63 |
| Elastic module [MPa] | G | G | G | G | O | O | VG | VG | VG | I | G | VO | VG | VG | F | VG | VG |
| 10% K value [kgf/mm2] | 4000 | 4000 | 4000 | 4000 | 4000 | 4000 | 4000 | 4000 | 4000 | 4000 | 4000 | 4000 | 4000 | 250 | 4000 | 700 | 4000 |
| Pasting properties | G | G | I | G | F | G | G | F | G | G | G | G | G | G | G | G | G |
| FPC-A | A1 | A2 | A1 | A1 | A1 | A1 | A1 | A1 | A1 | A1 | A1 | A1 | A1 | A1 | A1 | A1 | A1 |
| Peel strength [N/cm] | 7.9 | 7.9 | 7.2 | 8.4 | 8.0 | 8.9 | 8.7 | 7.0 | 6.2 | 8.2 | 7.1 | 8.1 | 9.2 | 6.4 | 8.2 | 8.4 | 9.0 |
| Flex, destruction | VG | VG | VG | VG | VG | VG | G | VG | G | VG | VG | O | F | G | G | G | I |
| Remounting initial resistance | O | O | O | G | G | G | G | G | I | G | G | I | FF | F | O | O | G |
| Remounting contruction reliability | G | G | G | G | O | G | G | G | I | I | O | I | FF | F | F | I | G |

As in Comparative Examples 1 to 3, in the case of the relation between the thickness A of the binder and the average particle diameter B not being within the range of 0.6≤B/A≤1.5, favorable evaluations were not achievable for both temporary pasting and for the flexible substrate B after detachment.

Further, as in Comparative Example 4, in the case of the thickness A of the binder significantly exceeding 15 μm, after detachment evaluation of the flexible substrate B was poor, and pressure bonding was made impossible. Still further, as in Comparative Example 5, in the case of the 10% K value being less than 500 kgf/mm², initial electrical resistance was high and evaluations of electrical resistance after the high-temperature and high-humidity test were poor. Yet further, as in Comparative Example 6, in the case of using an acrylic-type binder, because the elastic modulus was low at less than 50 MPa at 100° C., electrical resistance evaluations after the high-temperature and high-humidity test were poor.

In contrast, as in Examples 1 to 11, in the case of the relation between the thickness A of the binder and the average particle diameter B being within the range of 0.6≤B/A≤1.5, evaluations for temporary pasting and for the flexible substrate B after detachment were favorable. Particularly, in the case of the relation between the thickness A of the binder and the average particle diameter B being within the range of 0.6≤B/A≤1.0, evaluations for temporary pasting properties were especially favorable.

ment and could be used, achieving a favorable result. Yet further, as Examples 1 to 11, in the case of the 10% K value being 500 kgf/mm² or more, initial electrical resistance was low and evaluations of electrical resistance after the high-temperature and high-humidity test were favorable.

The invention claimed is:

1. A method for manufacturing a mounting body, the method comprising:
   a mounting step of mounting a first electronic component onto a wiring board by arranging the first electronic component onto the wiring board via an anisotropic conductive film containing a binder comprising (i) an epoxy resin and (ii) conductive particles having a compressive hardness K of 500 kgf/mm² or more when compressively deformed by 10%, a relation between a total thickness A of the anisotropic conductive film and an average particle diameter B of the conductive particles being 0.6≤B/A≤1.5;
   a curing step of curing the binder after the mounting step;
   a peeling step of mechanically peeling the first electronic component to detach the first electronic component from the wiring board after the mounting curing step;
   a remounting step of remounting the detached first electronic component, or mounting a second electronic component, onto the wiring board by reusing the wiring board to mechanically remount the detached electronic component, or mechanically mount the second electronic component, onto the wiring board by arranging the detached electronic component, or the second electronic component, onto the wiring board via the mounting step, wherein an elastic modulus of the binder at 100° C. after curing is 50 MPa or more.

2. The method for manufacturing a mounting body according to claim 1, wherein in the remounting step is performed in a state in which a residue of the anisotropic conductive film remains on the wiring board.

3. The method for manufacturing a mounting body according to claim 1, wherein the binder has a thickness of 15 µm or less.

4. The method for manufacturing a mounting body according to claim 1, wherein the relation between the total thickness A of the anisotropic conductive film and the average particle diameter B is 0.6≤B/A≤1.0.

5. The method for manufacturing a mounting body according to claim 3, wherein the relation between the total thickness A of the anisotropic conductive film and the average particle diameter B is 0.6≤B/A≤1.0.

6. The method for manufacturing a mounting body according to claim 1, wherein the binder has an elastic modulus after curing of 80 to 800 MPa at 100° C.

7. The method for manufacturing a mounting body according to claim 1, wherein the binder further comprises an elastomer made from an acrylic rubber.

8. The method for manufacturing a mounting body according to claim 1, wherein the wiring board and the first or second electronic component have a peel strength of 5.0 N/cm to 9.0 N/cm.

9. The method for manufacturing a mounting body according to claim 2, wherein the binder has a thickness of 15 µm or less.

10. The method for manufacturing a mounting body according to claim 2, wherein the relation between the total thickness A of the anisotropic conductive film and the average particle diameter B is 0.6≤B/A≤1.0.

11. The method for manufacturing a mounting body according to claim 2, wherein the binder has an elastic modulus after curing of 80 to 800 MPa at 100° C.

12. The method for manufacturing a mounting body according to claim 2, wherein the binder further comprises an elastomer made from an acrylic rubber.

13. The method for manufacturing a mounting body according to claim 2, wherein the wiring board and the first or second electronic component have a peel strength of 5.0 N/cm to 9.0 N/cm.

14. The method of manufacturing a mounting body according to claim 1, further comprising a determination step of determining whether a problem occurs after the mounting step.

15. The method of manufacturing a mounting body according to claim 1, wherein the relation between the total thickness A of the anisotropic conductive film and the average particle diameter B of the conductive particles is 0.6≤B/A≤0.83.

* * * * *